United States Patent [19]
Mahant-Shetti

[11] Patent Number: 5,793,068
[45] Date of Patent: Aug. 11, 1998

[54] COMPACT GATE ARRAY

[75] Inventor: Shivaling S. Mahant-Shetti, Richardson, Tex.

[73] Assignee: Texas Instruments Incorporated, Dallas, Tex.

[21] Appl. No.: 475,759

[22] Filed: Oct. 16, 1995

Related U.S. Application Data

[62] Division of Ser. No. 177,879, Jan. 3, 1994, abandoned.

[51] Int. Cl.$^6$ .................................................. H01L 27/10
[52] U.S. Cl. ........................ 257/204; 257/206; 257/211
[58] Field of Search .................................... 257/202, 203, 257/204, 205, 206, 211

[56] References Cited

U.S. PATENT DOCUMENTS

| | | | |
|---|---|---|---|
| 4,240,195 | 12/1980 | Clemens et al. | |
| 4,807,080 | 2/1989 | Clark | 361/56 |
| 5,146,306 | 9/1992 | Ferry et al. | |
| 5,292,678 | 3/1994 | Dhong et al. | 437/50 |
| 5,517,041 | 5/1996 | Torii et al. | 257/206 |

OTHER PUBLICATIONS

"Source/Drain Personalization of High Density CMOS Read-Only Store", IBM Technical Disclosure Bulletin, vol. 28, No. 11, Apr. 1986.

*Primary Examiner*—Ngân V. Ngô
*Attorney, Agent, or Firm*—Mark E. Courtney; W. James Brady, III; Richard L. Donaldson

[57] ABSTRACT

The gate array (10) has a first doped region (14) in a semiconductor substrate (12) and a plurality of contacts (20-20''', 21-21'') arranged in rows and columns to the first doped region (14) organized with contacts of each row offset in a column (25) that is spaced with respect to a columns (28) of adjacent rows at which a contact exists. A plurality of gate conductors (35-42) are arranged to circumnavigate successive contacts (20,21) of adjacent rows on opposite sides in a serpentine patterns, preferably that follow partially circular paths. The contacts (20,21) are substantially circular in cross section, and may be provided with cap (32) on each that may also have a substantially circular cross section. The contacts (20-21) are spaced with a predetermined pitch and the gate conductors (35-42) have a width that defines transistor channels between adjacent contacts. The width of the conductors (35-42) allows the conductors to pass in proximity to the contacts (20-21) with a predetermined spacing. The gate array (10) may have in the substrate a second doped region (15) of an opposite conductivity type from a conductivity type of the first doped region (14). A gate array similar to that constructed above the first doped region is constructed above the second doped region to enable diverse logic circuits to be constructed by selective interconnections among selected contact and gate conductors (50,51).

14 Claims, 3 Drawing Sheets

COMPACT GATE ARRAY

This is a division of application Ser. No. 08/177,879, filed Jan. 3, 1994, now abandoned.

BACKGROUND OF THE INVENTION

1. Field of the Invention

This invention relates to improvements in gate arrays, and methods for making and using them, and more particularly, to improvements in gate array layouts for increasing gate array density and simplifying connections for circuit construction.

2. Technological Background

Gate-arrays are finding increasing use in industry. A gate-array is an integrated logic circuit that is manufactured typically by first fabricating a two-dimensional structure that can be connected to form transistors, which, in turn, can be interconnected to provide one or a few logic gates, or base cells. Then, final layers of metalization are added to interconnect the cells to determine an overall function of the array in accordance with diverse custom orders.

Typically, prior art base cells used in gate-array structures are formed of pairs of two transistor structures, or devices, including n-channel transistors and p-channel transistors. Each pair of two transistors includes two n-channel transistors having a common node and a potential metal contact location at the common node. The p-channel transistors likewise include two p-channel transistors that have a common node and a metal contact location at the common node so that the n and p-channel transistors can be connected as desired by forming a metalization contact at the respective common nodes, as desired, in the formation of the final metalization layer or layers. Typically cells are separated by an isolation moat. The final array that is formed typically includes a large number of base cells that are suitably connected by upper level conductors. Thus, the layout and moat considerations determine the size and density of the resulting gate-array device that is formed.

More particularly, gate arrays are typically formed in doped regions in a semiconductor substrate that provide a large number of transistors that can be selectively interconnected to form desired custom circuits, usually logic circuits, such as NAND gates, NOR gates, or the like. In the construction of such logic circuits, typically a number of regions of opposite conductivity type are formed in the substrate, in each of which a number of transistors may be formed. The transistors therefore have a conductivity type determined by the conductivity type of the doped region in which they are constructed.

The doped regions are generally spaced from each other by an isolating moat so that a number of transistors of one conductivity type can be selectively interconnected within one region, and selectively connected to transistors of opposite conductivity type in an adjacent region to form the various desired logic circuits. The regions of opposite conductivity type are generally formed adjacent each other, usually as closely as possible to maximize the density of the array, but typically with a separation region between them for device isolation.

One popular type of gate array device construction is a so-called "sea of gates" array. In this type device, a number of contacts to the diffused region are provided. The contacts are arranged in a row-column matrix array, typically with one contact located at each intersection of a row and column matrix line. Each contact enables electrical connection to be selectively made to the diffused region contacted by the contact at that location. The underlying diffused regions at the respective locations can serve as either a source or drain region of a transistor, as determined by the gate conductor connections that are selectively established.

The gate conductors are formed by a number of conductor lines spanning the diffused regions between contacts along a pair column matrix lines. Typically, the gate conductors are formed along straight line paths extending across the diffused region, and are typically provided in pairs, since transistors are selected in pairs for most logic circuits to be defined. Each gate line of the pair lies between a pair of columns of the contact matrix to control a transistor channel between the contacts. Connections to the gate lines are then generally made from top to bottom of the diffused region over which the gate lines lie. In the traditional gate array, contacts are made on every row, but are connected in a staggered manner on alternate rows.

With the gate array constructed as described, various circuit connections can be made by second level conductors, for example, by metal or polysilicon, to contact selected contacts or selected gate lines. Such circuit connections can be established by predefined clusters of transistors, to form a function, or macro. Through such macros, typically a pair of transistors of one conductivity type in a first region are connected to a pair of transistors of an opposite conductivity type in a second region to form NAND or NOR gates, or other logic circuitry, as desired.

In the construction of such gate arrays, the "pitch" of the contacts is an important consideration. The "pitch" of the contacts is the spacing between adjacent contacts, and, desirably, is uniform across the local regions of the array. The uniformity of pitch relaxes the problems in designing second level conductors. However, in the past, because of the required layout of the gate conductors, especially of the transistor isolating regions, the pitch has generally been larger than necessary to accommodate the larger device features. This results in making the second level interconnect design looser than it needs to be. Also, the "pitch" of the overall array is an important consideration. The "pitch" of the of the overall array is governed by the worst of the pitches associated with contacts in the different diffusion regions of the array, and, desirably, should be uniform across the entire array.

What is needed is a gate array that has inherently a greater degree of pitch uniformity that enables interconnect macros to be relaxed, while providing a compact, or dense, array.

SUMMARY

In light of the above, it is, therefore, an object of the invention to provide an improved gate-array base cell design.

It is another object of the invention to provide a gate-array base cell design of the type described that can produce a higher density of gate-array cells.

It is another object of the invention to provide a method for arranging gate-array cells to enable a higher density array to be achieved.

It is another object of the invention to provide a gate array structure that has a tighter, uniform contact pitch.

One of the advantages achieved by the present invention is that a gate-array of higher density is enabled.

Another advantage of the gate-array cell arrangement of the invention is that separate cell isolation is eliminated by use of an off-transistor serving isolation purposes.

Thus, in accordance with a broad aspect of the invention, a gate array is presented. The gate array is of higher density than achieved heretofore, using pitch matching resulting from use of an "off" transistor to provide isolation and other spacing compacting techniques. The gate array has a first doped region in a semiconductor substrate with a plurality of contacts that contact the first doped region at a surface of the substrate, arranged in rows and columns. The columns are organized with contacts of each row offset or staggered in a column that is spaced with respect to a columns of an adjacent rows at which a contact exists. A plurality of gate conductors are arranged to circumnavigate successive contacts of adjacent rows on opposite sides along a serpentine path.

The contacts are substantially circular in cross section, and each is preferably provided with a cap that may also have a substantially circular cross section. In a preferred embodiment, the serpentine path that the conductors follow comprises a plurality of routes that follow partially circular paths. The contacts are spaced with a predetermined pitch and the gate conductors have a width that defines a transistor channel and passes in proximity to the contacts with a predetermined spacing, in accordance with the design rules of the array.

Also in a preferred embodiment, the gate array has a second doped region in the substrate of an opposite conductivity type from a conductivity type of the first doped region. A plurality of contacts to the second doped region are provided at a surface of the substrate. The plurality of contacts are also arranged in rows and columns, with the columns organized with contacts of each row offset in a column that is spaced between columns of contacts of adjacent rows. A plurality of conductors, likewise, are arranged to circumnavigate successive contacts of adjacent rows on opposite sides along a serpentine path.

In accordance with another broad aspect of the invention, a method for making a gate array is presented. The method includes doping a region of a semiconductor substrate to provide a doped region and forming a plurality of contacts to the doped region in a pattern of columns and rows, each column of each row being offset from a column of each adjacent row. A gate conductor is patterned along a serpentine path across the doped region to circumnavigate successive contacts of adjacent rows. The contacts are spaced with a predetermined pitch and the gate conductors formed with a width that defines a transistor channel within the doped region between contacts and passes in proximity to the contacts with a predetermined spacing. The step of patterning a gate conductor along a serpentine path comprises patterning the gate conductor along a path that comprises alternating partial circles.

BRIEF DESCRIPTION OF THE DRAWING

The invention is illustrated in the accompanying drawing in which.

In the various drawings, like reference numerals are used to denote like or corresponding parts. Additionally, the drawings are not necessarily drawn to scale.

DETAILED DESCRIPTION OF THE PREFERRED EMBODIMENTS

It should be noted that the process steps and structures herein described do not necessarily form a complete process flow for manufacturing integrated circuits. It is anticipated that the present invention may be practiced in conjunction with integrated circuit fabrication techniques currently used in the art, and only so much of the commonly practiced process steps are included as are necessary for an understanding of the present invention.

Programmable logic arrays that can be provided through gate-array devices have the potential for realizing any of a large number of different sets of logic functions, and may be used, for example, in such products as digital computers, video games, voice synthesizers, pocket calculators, robot controls, or the like. Typically, a gate-array may be formed of a number of logic gate devices, such as AND gates, OR gates, NAND gates, NOR gates, and so on, each gate being selectively included in the final device through means such as metal level interconnections to define the inputs and output connections to each individual gate and among the various gates. It should be noted that typically devices are partially completed, through a fabrication level at which a patterned polysilicon layer has been formed. These "blank" arrays can be subsequently completed to form custom circuits by customized patterned metalization layers. Such metal layers often can connect in virtually any desired way to predefined underlying polysilicon runs or diffusion layers to form the final desired interconnects.

Figure 1:
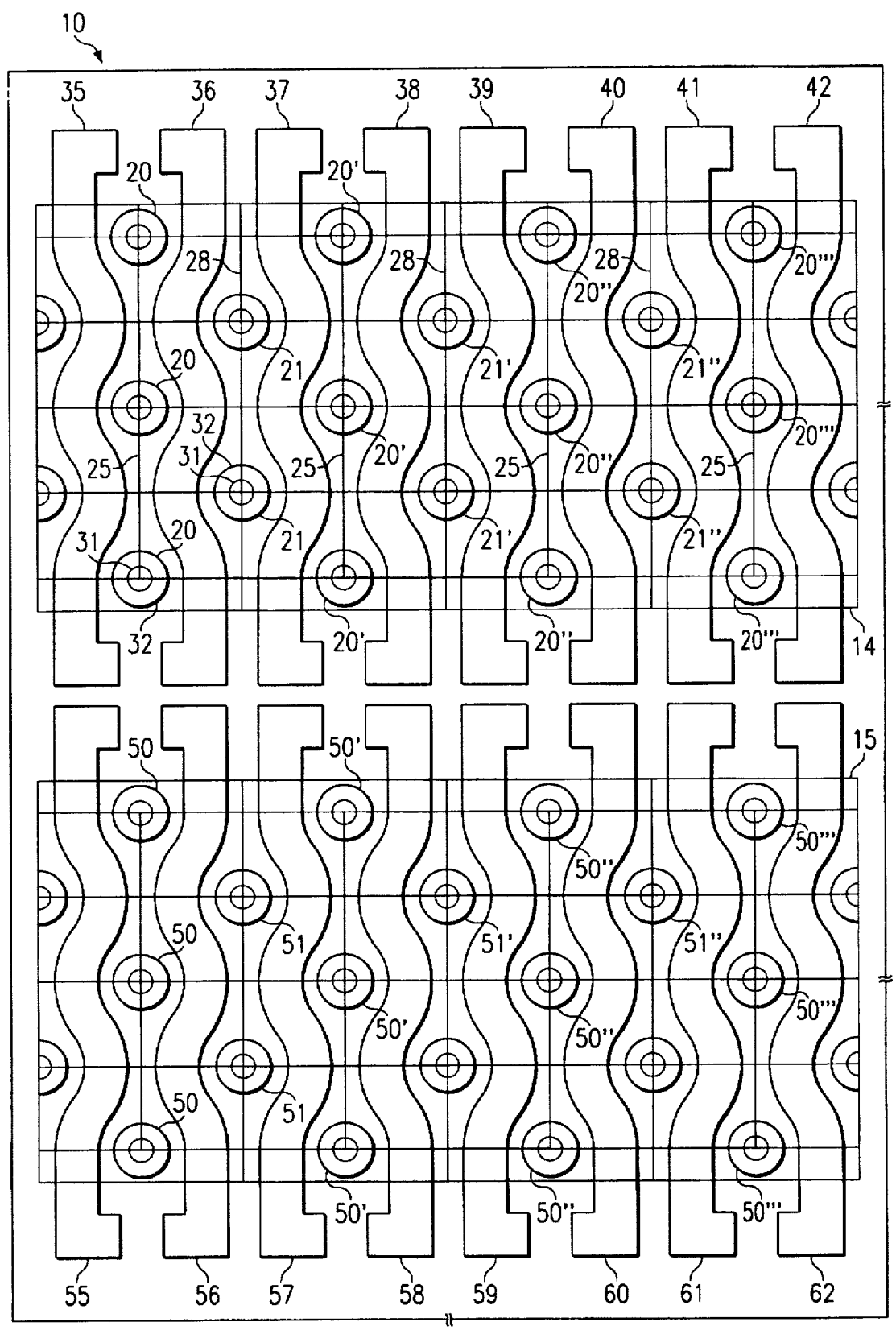
FIG. 1 is a top elevation of a portion of a gate-array device formed in accordance with the principals of the invention.

Accordingly, a gate array 10, in accordance with a preferred embodiment of the invention is shown in FIG. 1. The gate array 10 is constructed on a semiconductor substrate 12 that may be doped to have a desired conductivity type, for example p-type. A plurality of doped regions are provided in the substrate 12, two regions 14 and 15 being shown; however, it will be understood that a large number of similar regions, not shown, may be provided, at desired relative spacing. In the embodiment shown, the region 14 is doped to have a p-type conductivity in which p-channel transistor devices can be defined, and the region 15 is doped to have an n-type conductivity in which n-channel transistor devices can be defined.

A plurality of contacts 20, 21, 50, and 51 are provided to contact each of the doped regions 14 and 15 at various locations. A review of typical predominant connections for CMOS circuit functions reveals that providing such contacts at each of the doped regions does not cause a loss in access to the devices. Thus, the contacts are arranged in rows and columns, as shown, with the columns being organized with contacts of each row staggered or offset in a column that is spaced with respect to a columns of an adjacent rows at which a contact can exist. Thus, for example, contacts 20-20''' are arranged in the first, third, and fifth rows along column intersection lines 25. On the other hand, contacts 21-21" are arranged in the second and fourth rows along column intersection lines 28. The column lines 28 are located midway between the column lines 25, thereby offsetting the location of the contacts on the second and fourth rows. (It should be noted that the various column and row lines shown are imaginary construction lines, and are shown in FIG. 1 for only purposes of illustration.)

The various contacts 20 and 21 are ultimately formed with a base portion 31 having a circular cross section in the complete device, as shown, and with a cap 32, also having a circular cross sectional shape in the completed device. The cap 32 of each of the contacts 20 or 21 are dimensioned to enable subsequent interconnects to be selectively established to them, the particular dimensions in a particular application being determined by the design rules in accordance with which the gate array is fabricated.

It should be noted that the gate array layout is generally originally established on a computer using various computer aided design techniques. Additionally, the layout is performed according to predefined "design rules" that define the various parameters of the array layout. Such parameters include, for example, the spacing between the conductors and contacts, as well as device dimensions, such as of the transistor channel, the conductor widths, and so on. In most computer aided designs, a display is presented that depicts the configuration of the final layout; however, in most such presentations, the contacts are usually depicted as being of square shape (such as the contacts of the array portion shown in FIG. 2 below.) In the lithography masks, as well, the shape of the contacts may be a square. Nevertheless, in the final product, the ultimate shape of the contacts may be substantially circular in cross section, after the various processing steps have been performed. One of the reasons for this transformation is that during the lithography process, especially in submicron processes, the light that traverses the square contact definitions in the mask is focused to impinge the substrate target in the shape of a circle. Additionally, the contacts become exposed to etch materials, often in liquid form, which also tend to change any non-circular shape to a circular cross-sectional shape. The design rules, therefore, when applied to the apparently square contacts will nevertheless result in an ultimate structure of substantially circular cross sectional shape of correct radius, enabling a gate array dense and compact arrangement to be made.

A plurality of conductors 35–42 are arranged to extend across the doped region 14, so that contacts can be selectively established at enlarged end portions, as desired. The conductors 35–42 serve as the gate conductors of transistors that may be selectively formed by connections to selected contacts and gate conductors, as below described. The gate conductors are usually provided by a first conductor level of patterned metal or polysilicon. Furthermore, by biasing selected gate conductors by connection to $V_{cc}$ or ground, depending upon the conductivity of the underlying doped region, the transistors on each side of the biased gate conductor can be isolated from each other. For example, isolation can be provided among transistors in the p-type region by connection to $V_{cc}$, while isolation can be provided among transistors in the n-type region by connection to ground. This enables multiple transistors, or transistor pairs to be provided in each diffused region of the substrate.

Each of the gate conductors 35–42 circumnavigates the contacts of successive adjacent rows on opposite sides along serpentine paths. Thus, for example, the gate conductor 36 passes to the right of contact 20 and to the left of contact 21, the gate conductor 37 passes to the right of contacts 21 and to the left of contacts 20', and so on. Preferably the serpentine paths each comprises a plurality of routes that follow a path formed of partial circular segments. Also, preferably, the width of each of the gate conductors 35–42 defines the width of a transistor channel that may be established in the doped region 14, and additionally, passes in proximity to the contacts adjacent to the path of the gate conductor with a predetermined spacing determined by the design rules of the gate array. This construction results in a gate array of maximum density, and an array in which the pitch of the contacts 20–20''' and 21–21'' is uniform.

With a gate array so constructed, transistors can be defined by a second level conductor interconnect, for example of metal or polysilicon, between selected ones of the contacts 20–20''' and 21–21''. Also, by biasing selected ones of the gate conductors 35–42 to $V_{cc}$, transistors on each side of the biased conductors are isolated from each other. Thus, for example, by connecting gate conductors 35 and 38 to $V_{cc}$, a pair of adjacent p-channel FET devices that are isolated from other devices in the doped region 14 may be formed with contacts 20 and 21 to the drain and source of one FET, contacts 21 and 20' to the drain and source of the other FET, and with gate contacts 36 and 37 providing respective gate contacts.

As mentioned, a second doped region 15 is provided in the substrate 12. The second doped region 15 has an opposite conductivity type from the conductivity type of the first doped region 14, and, consequently, in the embodiment shown, is of n-type conductivity. A second array is formed over the n-type region 15, in the same manner as described above with respect to the array formed over the first doped region 14. Thus the array over the second doped region 15 includes a plurality of contacts 50 and 51 to the second doped region 15 arranged in rows and columns, the columns being organized with contacts 50–50''' of the first, third, and fifth rows offset in a column that is spaced between columns of contacts 51–51'' of adjacent second and fourth rows. A plurality of gate conductors 55–62 are arranged to circumnavigate successive contacts of adjacent rows on opposite sides in the same serpentine manner as the gate conductors 35–42, described above.

Figure 2:
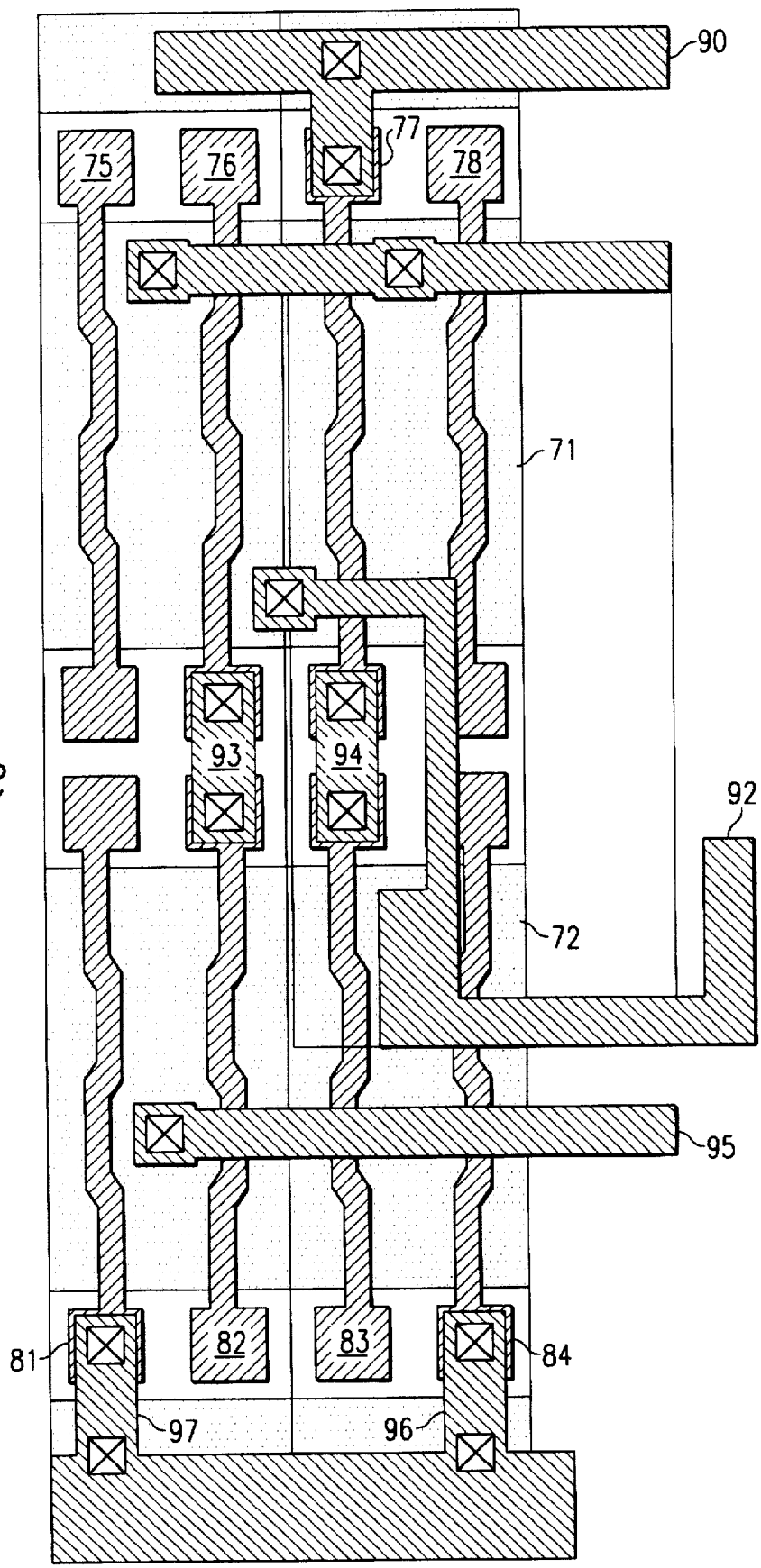
FIG. 2 is a computer generated model of a top elevation of a portion of a gate array device formed in accordance with an alternative embodiment of the invention that has been interconnected by second level connectors to form a logic circuit.
Figure 3:
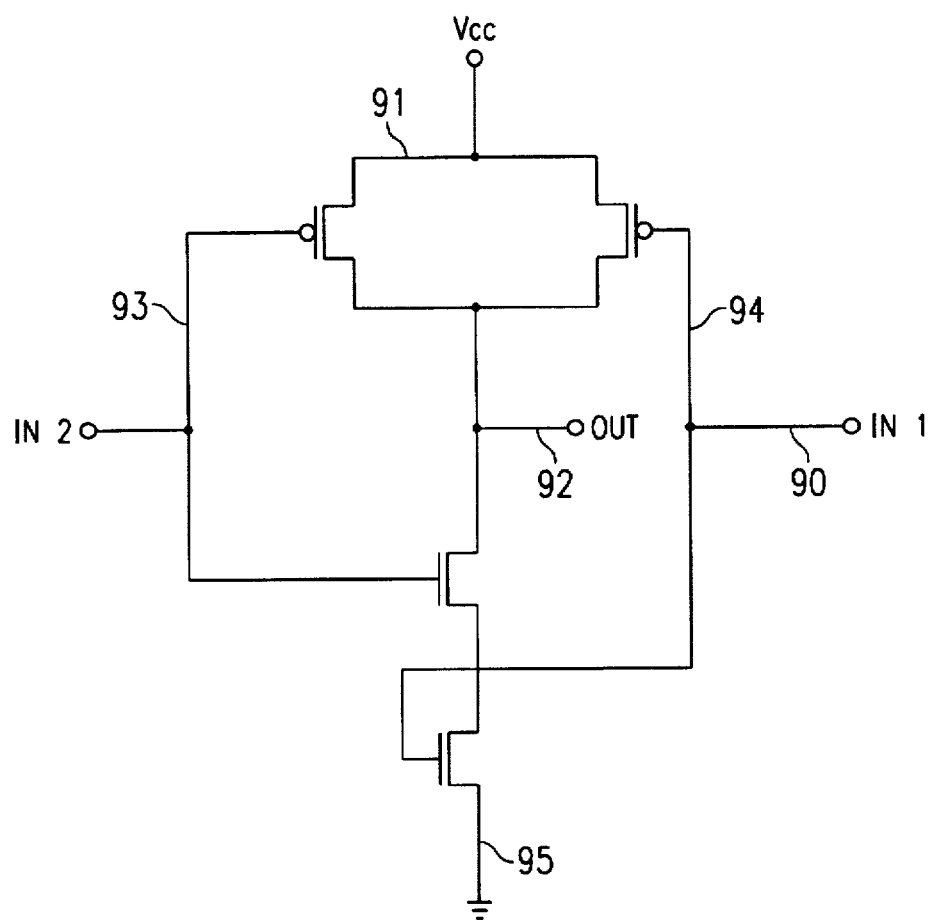
FIG. 3 is an electrical schematic diagram of a NAND gate, illustrating one of the logic circuits that can be formed by selective interconnections of the gate array of FIG. 2.

The transistor devices that may be formed above the n-type region 15 are n-channel FET devices, of opposite conductivity type from the FET devices formed above the doped region 14. Thus, by selectively forming and interconnecting FET devices in both the p-type doped region 14 and the n-type doped region, logic circuits may be easily designed and provided. A computer generated model of an example of a NAND gate formed by selective second metal level connections to a gate array 70, in accordance with an alternative embodiment of the invention is shown in FIG. 2. The electrical schematic diagram of the NAND gate that is defined by the particular interconnections selected in FIG. 2 is shown in FIG. 3, with corresponding interconnect lines correspondingly numbered in each figure.

The gate array 70 has a p-type doped region 71 and an n-type doped region 72, each having four gate conductors 75–78 and 81–84 respectively extending thereacross. Contacts are formed at the intersections of row and column lines, in a manner similar to that shown with regard to the array 10 of FIG. 1, although only the contact locations at which metal interconnections 90–96 are selectively made are shown. Although the various contacts in FIG. 2 as shown as having a square or rectangular cross sectional shape, a typical computer model designation, it will be understood that preferably the contacts will have a circular cross sectional shape, as described above with respect to FIG. 1. Selected ones of the various contacts are interconnected by second level metal interconnection techniques, such multilevel interconnection techniques being known in the art. The particular contacts selected for interconnection result in the NAND gate circuit shown in FIG. 3.

In the circuit shown in FIG. 2, only the actual connections are shown, but it should be noted that connections to other locations can be made, as desired to form other logic circuits, as known in the art.

Although the invention has been described and illustrated with a certain degree of particularity, it is understood that the present disclosure has been made only by way of example, and that numerous changes in the combination and arrangement of parts can be resorted to by those skilled in the art without departing from the spirit and scope of the invention, as hereinafter claimed.

I claim:

1. A gate array, comprising:

a semiconductor substrate;

a first doped region in said substrate;

a plurality of contacts to said first doped region at a surface of said first doped region;

said plurality of contacts being arranged in rows and columns, said columns being organized with contacts of each row offset in a column that is spaced with respect to columns of an adjacent rows at which a contact exists, said rows of contacts forming a staggered pattern along said columns;

and a plurality of gate conductors arranged to circumnavigate successive contacts of adjacent rows on opposite sides, said gate conductors traversing across said plurality of rows of contacts along a serpentine path.

2. The device of claim 1 wherein said contacts are substantially circular in cross section.

3. The device of claim 1 further comprising a cap on each of said contacts.

4. The device of claim 3 wherein each of said caps is substantially circular in cross section.

5. The device of claim 1 wherein said serpentine path comprises a plurality of routes that follow partially circular paths.

6. The device of claim 1 wherein said contacts are spaced with a predetermined pitch and the conductors have a width that defines a transistor channel in said first doped region and passes in proximity to said contacts with a predetermined spacing.

7. The device of claim 1 further comprising:

a second doped region in said substrate, said second doped region being of an opposite conductivity type from a conductivity type of said first doped region;

a plurality of contacts to said second doped region at a surface of said second doped region;

said plurality of contacts being arranged in rows and columns, said columns being organized with contacts of each row offset in a column that is spaced between columns of contacts of adjacent rows;

and a plurality of conductors, each arranged to circumnavigate successive contacts of adjacent rows on opposite sides.

8. The device of claim 7 wherein said contacts are spaced with a predetermined pitch and the conductors have a width that defines a transistor channel in said second doped region and passes in proximity to said contacts with a predetermined spacing.

9. A gate array, comprising:

a semiconductor substrate;

an n-type doped region in said substrate;

a plurality of n contacts to said n-type doped region at a surface of said n-type doped region;

said plurality of n contacts being arranged in rows and columns, said columns being organized with contacts of each row offset in a column that is spaced between columns of adjacent rows;

a first plurality of gate conductors arranged to circumnavigate successive contacts of adjacent rows;

a p-type doped region in said substrate;

a plurality of p contacts to said p-type doped region at a surface of said p-type doped region;

said plurality of p contacts being arranged in rows and columns, said columns being organized with contacts of each row offset in a column that is spaced between columns of contacts of adjacent rows;

and a second plurality of gate conductors, each arranged to circumnavigate successive contacts of adjacent rows.

10. The device of claim 9 wherein said contacts are substantially circular in cross section.

11. The device of claim 9 further comprising a cap on each of said contacts.

12. The device of claim 11 wherein each of said caps is substantially circular in cross section.

13. The device of claim 9 wherein said conductors follow a serpentine path to circumnavigate said contacts of adjacent rows.

14. The device of claim 9 wherein said conductors follow a serpentine path that comprises a plurality of routes that follow paths that are substantially partially circular.

* * * * *